US012487081B2

(12) United States Patent
Elazhary et al.

(10) Patent No.: US 12,487,081 B2
(45) Date of Patent: Dec. 2, 2025

(54) ON CHIP WAFER ALIGNMENT SENSOR

(71) Applicant: ASML Holding N.V., Veldhoven (NL)

(72) Inventors: Tamer Mohamed Tawfik Ahmed Mohamed Elazhary, New Canaan, CT (US); Mohamed Swillam, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 972 days.

(21) Appl. No.: 17/629,001

(22) PCT Filed: Jun. 30, 2020

(86) PCT No.: PCT/EP2020/068369
§ 371 (c)(1),
(2) Date: Jan. 21, 2022

(87) PCT Pub. No.: WO2021/013483
PCT Pub. Date: Jan. 28, 2021

(65) Prior Publication Data
US 2022/0268574 A1 Aug. 25, 2022

Related U.S. Application Data

(60) Provisional application No. 62/877,964, filed on Jul. 24, 2019.

(51) Int. Cl.
*G01B 11/27* (2006.01)
*G03F 9/00* (2006.01)

(52) U.S. Cl.
CPC .......... *G01B 11/272* (2013.01); *G03F 9/7049* (2013.01); *G03F 9/7069* (2013.01); *G03F 9/7088* (2013.01)

(58) Field of Classification Search
CPC ............. G03F 7/70605; G03F 7/70616; G03F 7/70625; G03F 7/70633; G03F 7/70641;
(Continued)

(56) References Cited

U.S. PATENT DOCUMENTS 3,819,274 A * 6/1974 Koulicovitch ......... G01D 5/266
356/396
4,636,077 A * 1/1987 Nomura .............. G03F 7/70408
356/400
(Continued)

FOREIGN PATENT DOCUMENTS

CN 102402140 A 4/2012
EP 2 003 681 A1 12/2008
(Continued)

OTHER PUBLICATIONS

International Search Report and Written Opinion of the International Searching Authority directed to related International Patent Application No. PCT/EP2020/068369, mailed Oct. 30, 2020; 8 pages.

(Continued)

*Primary Examiner* — Gordon J Stock, Jr.
(74) *Attorney, Agent, or Firm* — Sterne, Kessler, Goldstein & Fox PLLC (57) ABSTRACT

A sensor apparatus includes an illumination system, a detector system, and a processor. The illumination system is configured to transmit an illumination beam along an illumination path and includes an adjustable optic. The adjustable optic is configured to transmit the illumination beam toward a diffraction target on a substrate that is disposed adjacent to the illumination system. The transmitting generates a fringe pattern on the diffraction target. A signal beam includes diffraction order subbeams that are diffracted by the diffraction target. The detector system is configured to collect the signal beam. The processor is configured to measure a characteristic of the diffraction target based on the signal beam. The adjustable optic is configured to adjust an angle of incidence of the illumination beam on the diffrac-
(Continued)

tion target to adjust a periodicity of the fringe pattern to match a periodicity of the diffraction target.

15 Claims, 5 Drawing Sheets

(58) Field of Classification Search
CPC ............... G03F 7/7065; G03F 7/70653; G03F 7/70681; G03F 7/70683; G03F 7/706843; G03F 7/706849; G03F 7/706851; G03F 9/7003; G03F 9/7046; G03F 9/7049; G03F 9/7069; G03F 9/7073; G03F 9/7076; G03F 9/7088; G03F 9/7084; G01B 11/14; G01B 11/26; G01B 11/27; G01B 11/272
See application file for complete search history.

(56) References Cited

U.S. PATENT DOCUMENTS

| | | | | |
|---|---|---|---|---|
| 4,710,026 A | * | 12/1987 | Magome | G03F 9/7049 356/400 |
| 5,000,573 A | * | 3/1991 | Suzuki | G03F 7/70633 356/400 |
| 5,053,628 A | | 10/1991 | Yamamoto et al. | |
| RE34,010 E | * | 7/1992 | Magome | G03F 9/7049 356/488 |
| 5,160,849 A | * | 11/1992 | Ota | G03F 7/70633 250/548 |
| 5,171,999 A | * | 12/1992 | Komatsu | G03F 9/7049 250/548 |
| 5,333,050 A | * | 7/1994 | Nose | G03F 7/70633 356/490 |
| 5,343,292 A | | 8/1994 | Brueck et al. | |
| 5,347,356 A | | 9/1994 | Ota et al. | |
| 5,369,486 A | * | 11/1994 | Matsumoto | G03F 9/7049 356/488 |
| 5,498,878 A | * | 3/1996 | Hasegawa | G03F 7/70633 250/548 |
| 5,525,808 A | | 6/1996 | Irie et al. | |
| 5,559,598 A | * | 9/1996 | Matsumoto | G03F 7/70633 356/490 |
| 5,559,601 A | | 9/1996 | Gallatin et al. | |
| 5,568,257 A | | 10/1996 | Ota et al. | |
| 5,585,923 A | * | 12/1996 | Nose | G03F 7/70633 250/548 |
| 5,682,239 A | * | 10/1997 | Matsumoto | G03F 9/70 250/548 |
| 5,751,426 A | * | 5/1998 | Nose | G03F 7/70633 356/494 |
| 5,760,411 A | | 6/1998 | Kawakubo | |
| 6,018,391 A | * | 1/2000 | Yoshida | G01N 21/94 356/237.4 |
| 6,239,443 B1 | * | 5/2001 | Tojo | G03F 9/7049 250/548 |
| 6,304,318 B1 | * | 10/2001 | Matsumoto | G03F 7/7045 355/53 |
| 6,768,543 B1 | * | 7/2004 | Aiyer | G01N 21/956 356/237.4 |
| 7,528,953 B2 | | 5/2009 | Frommer et al. | |
| 8,582,079 B2 | * | 11/2013 | Liu | G03F 7/70408 355/68 |
| 9,709,902 B2 | | 7/2017 | Hetzler et al. | |
| 10,317,808 B2 | | 6/2019 | Huisman et al. | |
| 10,794,689 B2 | * | 10/2020 | Smith | G01B 11/25 |
| 2008/0088843 A1 | | 4/2008 | Shibazaki | |
| 2009/0097008 A1 | * | 4/2009 | Mos | G03F 9/7088 355/71 |
| 2009/0153825 A1 | | 6/2009 | Edart et al. | |
| 2009/0170038 A1 | | 7/2009 | Amako et al. | |
| 2009/0246706 A1 | | 10/2009 | Hendel et al. | |

FOREIGN PATENT DOCUMENTS

| | | | |
|---|---|---|---|
| JP | H05-62881 A | | 3/1993 |
| JP | H0587528 A | * | 4/1993 |
| JP | H0715368 B2 | * | 2/1995 |
| JP | H 08-213299 A | | 8/1996 |
| JP | H08250391 A | * | 9/1996 |
| JP | H 09-097758 A | | 4/1997 |
| JP | H09-138110 A | | 5/1997 |
| JP | H09-508463 A | | 8/1997 |
| JP | H10-122815 A | | 5/1998 |
| JP | H10-267615 A | | 10/1998 |
| JP | 2000-031443 A | | 1/2000 |
| JP | 3095036 B2 | * | 10/2000 |
| JP | 2008-532320 A | | 8/2008 |
| JP | 2009-147317 A | | 7/2009 |
| JP | 2019-503504 A | | 2/2019 |
| TW | 2012-34127 A | | 8/2012 |

OTHER PUBLICATIONS

International Preliminary Report on Patentability directed to related International Patent Application No. PCT/EP2020/068369, issued Jan. 25, 2022; 6 pages.

\* cited by examiner

ON CHIP WAFER ALIGNMENT SENSOR

CROSS-REFERENCE TO RELATED APPLICATIONS

This application claims priority of U.S. Provisional Patent Application No. 62/877,964 which was filed on Jul. 24, 2019, and which is incorporated herein in its entirety by reference.

FIELD

The present disclosure relates to sensor apparatuses and systems for lithographic apparatuses and systems, for example.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, one or more diffraction targets (i.e., alignment marks) are generally provided on, for example, the substrate, and the lithographic apparatus includes one or more alignment sensors by which the position of the diffraction target can be measured accurately. Existing alignment systems and techniques are subject to certain drawbacks and limitations. For example, they are generally incapable of measuring distortions within the alignment mark field (i.e., intra-field distortion). These systems are in general relatively bulky. They also do not support finer alignment grating pitches, for example, grating pitches less than about 1 micron.

Self-aligned and compact systems can provide improved accuracy, cost efficiency, and scalability since hundreds of sensors can be implemented on the same common platform. Integration of components (e.g., illumination source, fibers, mirrors, lenses, waveguides, detectors, processor, etc.) can provide a miniaturized sensor for measuring a particular characteristic (e.g., alignment position, etc.) of an alignment mark on a substrate. Additionally, multiple alignment marks of the same substrate can be investigated by multiple sensors (e.g., sensor array) and different measurements can be conducted simultaneously or in real-time.

Accordingly, there is a need to compensate for variations in a sensor apparatus and system, and provide a reduced footprint and self-aligned compact sensor that is scalable and capable of measuring intra-field distortion.

SUMMARY

In some embodiments, a sensor apparatus includes an illumination system, a detector system, and a processor. The illumination system is configured to transmit an illumination beam along an illumination path. The illumination system includes an adjustable optic. The adjustable optic is configured to transmit the illumination beam toward a diffraction target on a substrate that is disposed adjacent to the illumination system. The transmitting generates a fringe pattern on the diffraction target. A signal beam includes diffraction order sub-beams that are diffracted by the diffraction target. The detector system is configured to collect the signal beam. The processor is configured to measure a characteristic of the diffraction target based on the signal beam. The adjustable optic is configured to adjust an angle of incidence of the illumination beam on the diffraction target to adjust a periodicity of the fringe pattern to match a periodicity of the diffraction target.

In some embodiments, the characteristic of the diffraction target is an alignment position.

In some embodiments, the adjustable optic includes a prism mirror. The prism mirror is configured to adjust a position of the illumination beam by adjusting a position of the prism mirror relative to the illumination beam. In some embodiments, the prism mirror includes a microelectromechanical system-based actuator.

In some embodiments, the adjustable optic includes a variable phase modulator. The variable phase modulator is configured to adjust a position of the illumination beam by adjusting a propagation constant of the variable phase modulator. In some embodiments, the variable phase modulator includes an electro-optic modulator, an acousto-optic modulator, or a liquid crystal modulator.

In some embodiments, the illumination system includes a coherent illumination source and the illumination beam includes a first coherent off-axis illumination beam and a second coherent off-axis illumination beam. In some embodiments, the fringe pattern is generated by interference of the first and second coherent off-axis illumination beams. In some embodiments, the illumination system includes a first optic configured to transmit the first coherent off-axis illumination beam toward the diffraction target and a second optic configured to transmit the second coherent off-axis illumination beam toward the diffraction target. In some embodiments, an angle of incidence of the first coherent off-axis illumination beam and an angle of incidence of the second coherent off-axis illumination beam are the same.

In some embodiments, the detector system includes a fixed optic configured to collect the signal beam and a detector configured to detect a first diffraction order sub-beam of the signal beam, a second diffraction order sub-beam of the signal beam, and a third diffraction order sub-beam of the signal beam. In some embodiments, the detector comprises a multi-mode fiber.

In some embodiments, the illumination system and the detector system are separated by an angle of about 1 degrees to about 3 degrees.

In some embodiments, a longitudinal area of the sensor apparatus is no greater than about 10 mm by 10 mm. In some embodiments, the illumination beam wavelength is about 500 nm to about 2000 nm. In some embodiments, the illumination beam includes a first coherent off-axis illumination beam and a second coherent off-axis illumination beam, and the detector system is disposed between the first and second coherent off-axis illumination beams.

In some embodiments, a detection system includes a plurality of sensors. The plurality of sensors are arranged symmetrically relative to each other and disposed above a plurality of diffraction targets on a substrate. Each sensor includes an illumination system, a detector system, and a processor. The illumination system is configured to transmit an illumination beam along an illumination path and includes an adjustable optic configured to transmit the illumination beam toward a diffraction target on a substrate that is disposed adjacent to the illumination system. The transmitting generates a fringe pattern on the diffraction target. A signal beam includes diffraction order sub-beams that are diffracted by the diffraction target. The detector system is configured to collect the signal beam. The processor is configured to measure a characteristic of the diffraction target based on the signal beam. The adjustable optic is configured to adjust an angle of incidence of the illumination beam on the diffraction target to adjust a periodicity of the fringe pattern to match a periodicity of the diffraction target. The detection system further includes a second processor coupled to each sensor. The second processor is configured to determine a processing error based on the characteristic of each diffraction target of the plurality of diffraction targets on the substrate.

In some embodiments, the characteristic of the diffraction target is an alignment position.

In some embodiments, each detector system measures the characteristic of the plurality of diffraction targets on the substrate simultaneously. In some embodiments, the plurality of sensors are integrated on a common platform. In some embodiments, the second processor is coupled to each sensor via an optical fiber.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

Figure 1:
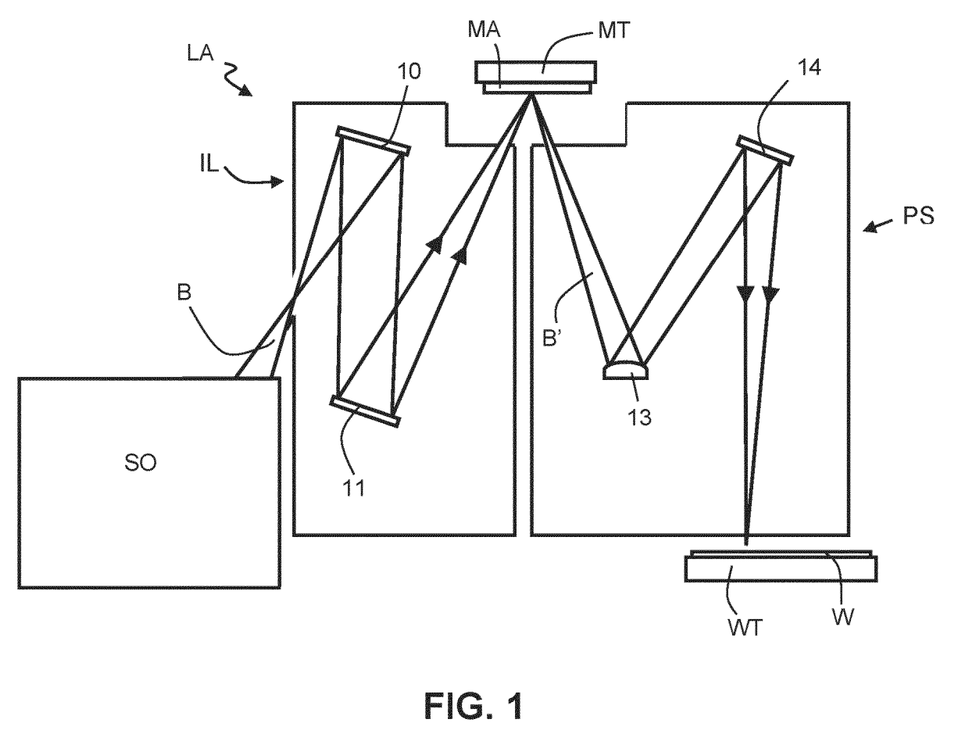
FIG. 1 is a schematic illustration of a lithographic apparatus, according to an exemplary embodiment.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Sensor Apparatus

As discussed above, in order to control the lithographic process to place device features accurately on the substrate, one or more diffraction targets (i.e., alignment marks) are generally provided on, for example, the substrate, and the lithographic apparatus can include one or more alignment sensors by which the position of the diffraction target can be measured accurately. Moreover, a fringe pattern can be formed by two off-axis coherent beams of an alignment sensor to provide structured illumination, which acts as a projected reference grating to investigate alignment mark asymmetry and eliminates the need for a separate physical reference grating.

Existing alignment systems and techniques are subject to certain drawbacks and limitations. For example, they are generally incapable of measuring distortions within the alignment mark field (i.e., intra-field distortion). Further, these systems are in general relatively bulky. Moreover, these systems do not support finer alignment grating pitches, for example, grating pitches less than about 1 micron.

Process induced wafer errors are a main contributor to On Product Overlay (OPO) errors. OPO errors are attributed to the complexity of the patterns as well as the quantity of patterned layers. OPO errors are of relatively high spatial variation, which can vary from wafer to wafer as well as within each wafer. Measurement of the relative position of several alignment marks within a field can reduce and help correct OPO errors. Alignment error variations within the field can be used, for example, in a regression model to correct OPO errors within the field. Measurement of a plurality of alignment marks can enable modeling and correction of intra-field distortion. For example, to enable correction of intra-field distortion without impacting overall throughput, parallel wafer alignment sensors can be implemented.

Parallel wafer alignment sensors based on interferometry and multi-mode interference (MMI) are described in U.S. Provisional Application No. 62/724,198, filed Aug. 29, 2018 and titled "Compact Alignment Sensor Arrangements," which is hereby incorporated by reference in its entirety. However, MMI designs require high stability and phase accuracy for precise and consistent wafer alignment. Further, coupling losses are large for MMI designs and a more direct measurement is desired.

Self-aligned and compact direct measurement sensor systems provide improved accuracy, cost efficiency, and scalability. Compact sensors, on the order of about 10 mm×10 mm, for example, implemented on the same common platform, can form a sensor array of hundreds of sensors. These miniaturized sensors (e.g., 10 mm×10 mm) can measure a particular characteristic (e.g., alignment position, etc.) of an alignment mark on a substrate. Also, integration of components (e.g., illumination source, fibers, mirrors, lenses, waveguides, detectors, processor, etc.) in a single "on chip" sensor can improve miniaturization. Additionally, multiple alignment marks of the same substrate can be investigated by multiple sensors (e.g., sensor array) and different measurements can be conducted simultaneously or in real-time. Self-aligned and compact sensor systems as discussed below can provide a reduced footprint and can improve measurements of intra-field distortion.

Figure 2:
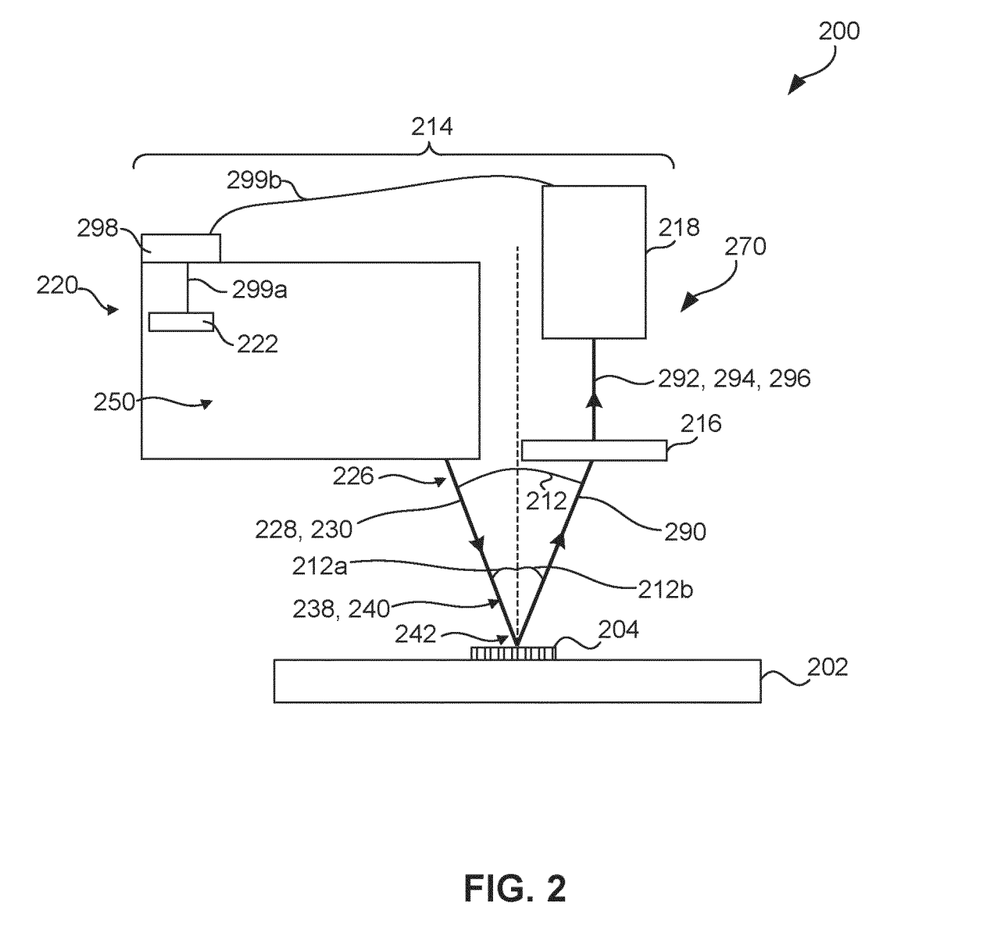
FIG. 2 is a side schematic illustration of a sensor apparatus, according to an exemplary embodiment.
Figure 3:
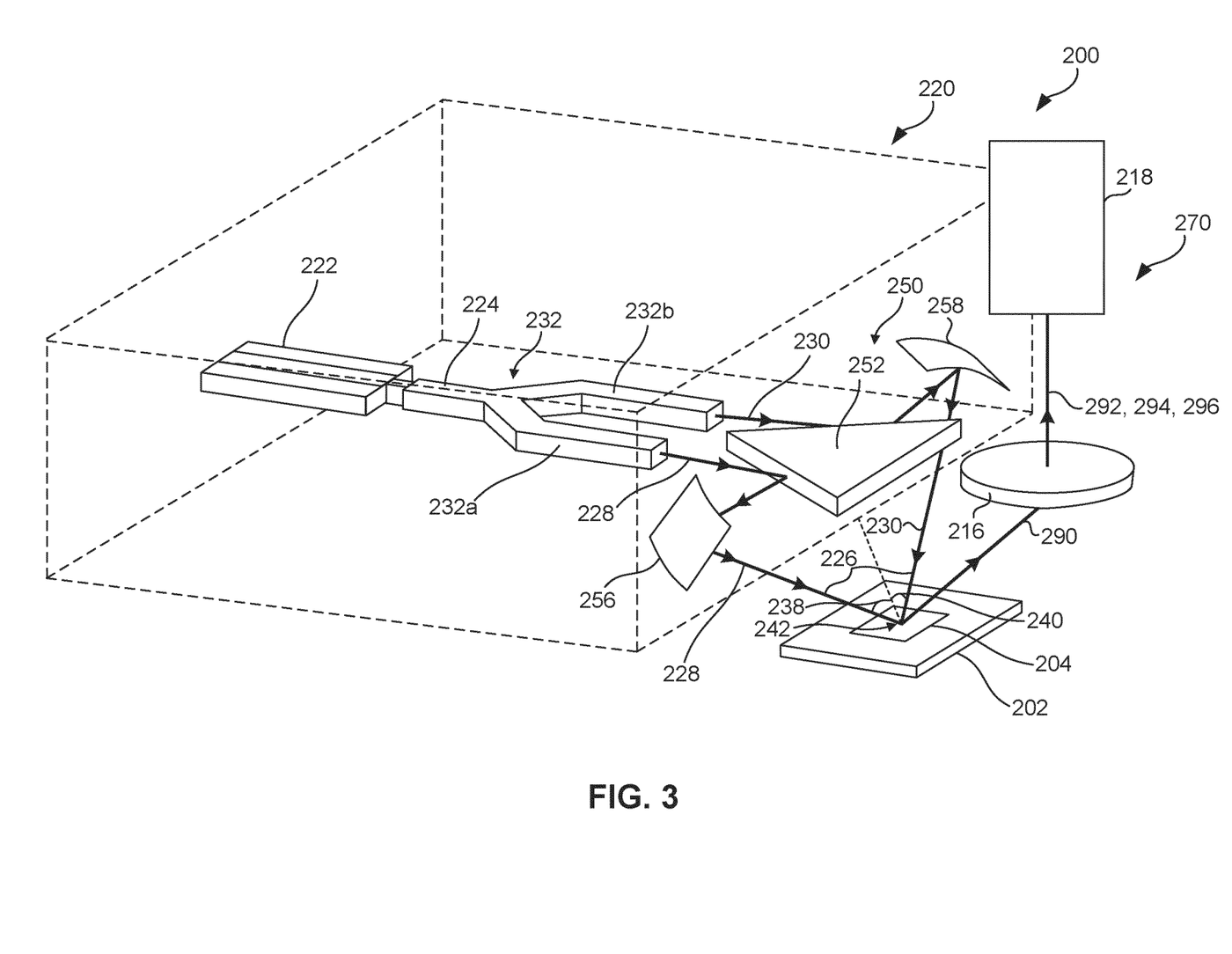
FIG. 3 is a top perspective schematic illustration of an illumination system of the sensor apparatus of FIG. 2, according to an exemplary embodiment.

FIGS. 2 and 3 illustrate sensor apparatus 200, according to various exemplary embodiments. Sensor apparatus 200 can be configured to measure a characteristic (e.g., alignment position, etc.) of diffraction target 204 on substrate 202 and improve alignment and intra-field distortion, for example, in lithographic apparatus LA. Although sensor apparatus 200 is shown in FIGS. 2 and 3 as a stand-alone apparatus, the embodiments of this disclosure are not limited to this example, and sensor apparatus 200 embodiments of this disclosure can be used with other optical systems, such as, but not limited to, lithographic apparatus LA and/or other optical systems.

FIG. 2 illustrates a side schematic of sensor apparatus 200, according to an exemplary embodiment. Sensor apparatus 200 can include illumination system 220, detector system 270, and processor 298. FIG. 3 illustrates a top perspective schematic of illumination system 220 of sensor apparatus 200 as shown in FIG. 3, according to an exemplary embodiment.

Illumination system 220 can be configured to transmit illumination beam 226 along illumination path 232 toward diffraction target 204 to form fringe pattern 242. Fringe pattern 242 (e.g., a Moiré pattern) can be configured to provide structured illumination and act as a projected reference grating to investigate diffraction target 204 asymmetry by utilizing the Moiré effect. The Moiré effect is a large-scale interference effect that occurs when an opaque pattern with transparent gaps (e.g., parallel lines) is overlaid on another similar pattern.

Figure 4:
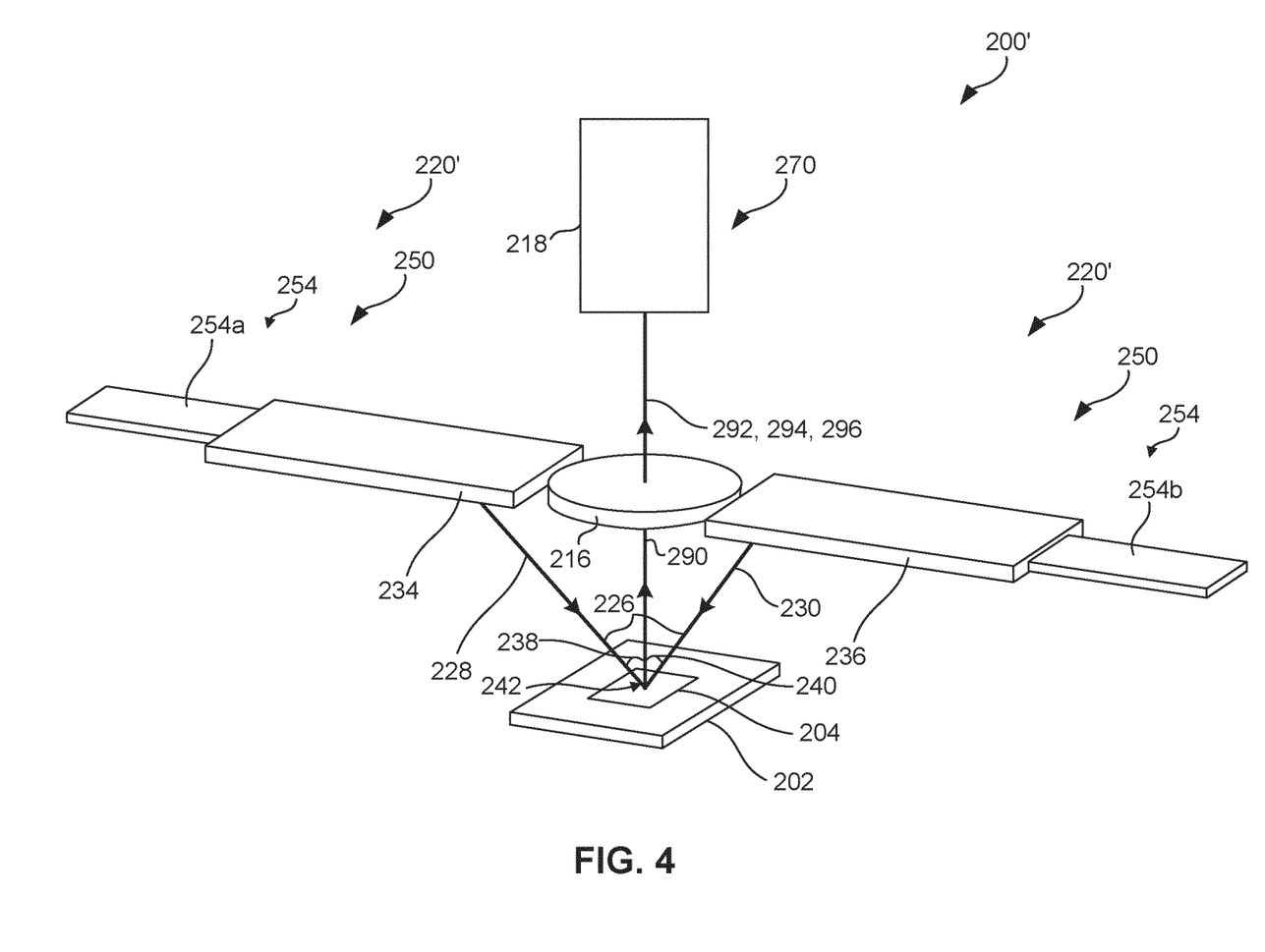
FIG. 4 is a top perspective schematic illustration of an alternative sensor apparatus, according to an exemplary embodiment.

As shown in FIG. 3, illumination system 220 can include coherent illumination source 222, illumination coupling 224, illumination beam 226, first coherent off-axis illumination beam 228, second coherent off-axis illumination beam 230, illumination path 232, first angle of incidence 238, second angle of incidence 240, fringe pattern 242, and adjustable optic 250. Illumination source 222 can produce illumination beam 226 and be coupled to illumination coupling 224, for example, a fiber optic port or waveguide. In some embodiments, illumination system 220 can include one or more waveguides or gratings to couple illumination beam 226 toward diffraction target 204. For example, as shown in FIG. 4, illumination system 220 can include first and second illumination waveguides 234, 236, which can be, for example, a subwavelength structure or a grating and be configured to couple light from coherent illumination source 222 out of illumination system 220 toward diffraction target 204.

Illumination system 220 can be configured to provide a coherent electromagnetic broadband illumination beam 226 having one or more passbands. In an example, the one or more passbands may be within a spectrum of wavelengths between about 500 nm to about 2000 nm. Illumination system 220 can be further configured to provide one or more passbands having substantially constant center wavelength (CWL) values over a long period of time (e.g., over a lifetime of illumination system 220).

Illumination coupling 224 can direct illumination beam 226 along illumination path 232 to diffraction target 204. Illumination coupling 224, for example, a waveguide, splits the illumination beam 226 from coherent illumination source 222 into first coherent off-axis illumination beam 228 and second coherent off-axis illumination beam 230. Illumination path 232 can include first illumination path 232a and second illumination path 232b, for example, as shown in FIG. 3. First coherent off-axis illumination beam 228 can be directed along first illumination path 232a to diffraction target 204. Second coherent off-axis illumination beam 230 can be directed along second illumination path 232b to diffraction target 204. First and second coherent off-axis illumination beams 228, 230 are directed toward diffraction target 204 on substrate 202 that is disposed adjacent to illumination system 220.

As shown in FIGS. 2 and 3, first and second coherent off-axis illumination beams 228, 230 can generate fringe pattern 242 on diffraction target 204. First coherent off-axis illumination beam 228 can be directed to diffraction target 204 at first angle of incidence 238, and second coherent off-axis illumination beam 230 can be directed to diffraction target 204 at second angle of incidence 240. First and second coherent off-axis illumination beams 228, 230 can overlap and interfere to form a structured illumination, fringe pattern 242, since the beams are coherent. Fringe pattern 242 (e.g., a Moiré pattern) can operate as a projected reference grating on diffraction target 204.

Adjustable optic 250 can be configured to transmit first and second coherent off-axis illumination beams 228, 230 toward diffraction target 204 on substrate 202 and adjust first and second angles of incidence 238, 240, respectively, to adjust a periodicity of fringe pattern 242. The periodicity of fringe pattern 242 can be proportional to first and second angles of incidence 238, 240. Adjustable optic 250 can be configured to match a periodicity of diffraction target 204 with a periodicity of fringe pattern 242 by adjusting first and second angles of incidence 238, 240 to change the periodicity of fringe pattern 242. When the periodicity of fringe pattern 242 is aligned with (e.g., matches) the periodicity of diffraction target 204, aberrations in sensor apparatus 200 do not alter signal beam 290 detected by detector system 270.

Adjustable optic 250 can be any optic (e.g., mirror, lens, prism, waveguide, optical modulator, etc.) capable of altering first and second angles of incidence 238, 240 of first and second coherent off-axis illumination beams 228, 230. For example, as described in detail below with reference to FIG. 3, adjustable optic 250 can include adjustable prism mirror 252 and first and second off-axis mirrors 256, 258. For example, as described in detail below with reference to FIG. 4, adjustable optic 250 can include first and second variable phase modulators 254a, 254b and/or first and second illumination waveguides 234, 236, respectively.

As shown in FIG. 3, adjustable optic 250 can include adjustable prism mirror 252, first off-axis mirror 256, and second off-axis mirror 258. Adjustable prism mirror 252 can be configured to adjust a position of first and second coherent off-axis illumination beams 228, 230 by adjusting a position of adjustable prism mirror 252 relative to illumination beam 226. For example, adjustable prism mirror 252 can translate toward or away from illumination coupling 224 or rotate or tilt with respect to illumination coupling 224 to alter a spot position of first and second coherent off-axis illumination beams 228, 230 on first and second coherent off-axis mirrors 256, 258, respectively. By adjusting a position of adjustable prism mirror 252 relative to illumination beam 226, first and second angles of incidence 238, 240 of first and second coherent off-axis illumination beams 228, 230, respectively, can be changed such that a periodicity of fringe pattern 242 is proportionally changed. Adjustable prism mirror 252 can be adjusted (e.g., translated, rotated, tilted, etc.) to adjust the periodicity of fringe pattern 242 to match the periodicity of diffraction target 204. First and second off-axis mirrors 256, 258 can be fixed and be configured to reflect first and second coherent off-axis illumination beams 228, 230, respectively, toward diffraction target 204.

In some embodiments, adjustable prism mirror 252 can include a microelectromechanical system (MEMS)-based actuator and be configured to adjust first and second illumination paths 232a, 232b of first and second coherent off-axis illumination beams 228, 230, respectively, and first and second angles of incidence 238, 240 of first and second coherent off-axis illumination beams 228, 230, respectively. For example, MEMS-based actuator of adjustable prism mirror 252 can control a focal spot of first and second coherent off-axis illumination beams 228, 230 on diffraction target 204. In some embodiments, first and/or second off-axis mirrors 256, 258 can be a flat, angled, parabolic, or elliptical mirror. For example, as shown in FIG. 3, first and second off-axis mirrors 256, 258 can be parabolic. In some embodiments, first and/or second off-axis mirrors 256, 258 can be adjustable. For example, first and/or second off-axis mirrors 256, 258 can each include a MEMS-based actuator.

In some embodiments, first angle of incidence 238 and second angle of incidence 240 can be the same. In some embodiments, first and second coherent off-axis illumination beams 228, 230 can be focused beams on diffraction target 204. For example, adjustable optic 250 can include focusing optics, for example, first and second off-axis mirrors 256, 258 optimized for a focal length of about 1 mm or less. In some embodiments, first and second coherent off-axis illumination beams 228, 230 can be defocused beams on diffraction target 204.

First and second coherent off-axis illumination beams 228, 230 from coherent illumination source 222 transmit toward diffraction target 204 on substrate 202, disposed adjacent to illumination system 220, and generate signal beam 290. Signal beam 290 can include diffraction order sub-beams diffracted from diffraction target 204. For example, as shown in FIGS. 2 and 3, signal beam 290 can include first diffraction order sub-beam 292, second diffraction order sub-beam 294, and third diffraction order sub-beam 296.

In some embodiments, first diffraction order sub-beam 292 can be a negative diffraction order sub-beam (e.g., −1), second diffraction order sub-beam 294 can be a positive diffraction order sub-beam (e.g., +1), and third diffraction order sub-beam 296 can be a zeroth diffraction order sub-beam (e.g. 0). As shown in FIGS. 2 and 3, first, second, and third diffraction order sub-beams 292, 294, 296 can be transmitted toward detector system 270, for example, toward fixed optic 216 and detector 218.

Detector system 270 can be configured to collect signal beam 290. As shown in FIGS. 2 and 3, detector system 270 can include fixed optic 216 and detector 218. Fixed optic 216 can be configured to collect signal beam 290 and transmit signal beam 290 toward detector 218. Detector 218 can be configured to detect first, second, and/or third diffraction order sub-beams 292, 294, 296 of signal beam 290. In some embodiments, fixed optic 216 can be a low numerical aperture (NA) lens. For example, fixed optic 216 can have an NA of about 0.1 to about 0.4. In some embodiments, fixed optic 216 can be achromatic lens. For example, fixed optic 216 can be an achromatic doublet. In some embodiments, detector system 270 can be configured to measure a characteristic of diffraction target 204 based on signal beam 290. In some embodiments, the characteristic of diffraction target 204 measured by detector system 270 is an alignment position. In some embodiments, detector 218 can be a photodetector, photodiode, charge-coupled device (CCD), avalanche photodiode (APD), camera, PIN detector, multimode fiber, single-mode fiber, or any other suitable optical detector.

In an embodiment, diffraction target 204 can be an alignment mark. In an embodiment, substrate 202 can be supported by a stage and centered along an alignment axis. In some embodiments, diffraction target 204 on substrate 202 can be a 1-D grating, which is printed such that after development, bars are formed of solid resist lines. In some embodiments, diffraction target 204 can be a 2-D array or grating, which is printed such that, after development, a grating is formed of solid resist pillars or vias in the resist. For example, bars, pillars, or vias can alternatively be etched into substrate 202.

Processor 298 can be configured to measure a characteristic of diffraction target 204 based on signal beam 290. Processor 298 can be integrated with detector system 270, illumination system 220, or external to detector system 270 and illumination system 220. For example, as shown in FIG. 2, processor 298 can be disposed on a top surface of illumination system 220. As shown in FIG. 2, processor 298 can include first control signal 299a and/or second control signal 299b. First control signal 299a can be configured to send and receive data between coherent illumination source 222 and processor 298. Second control signal 299b can be configured to send and receive data between detector 218 and processor 298. Processor 298 can be coupled to illumination system 220 via first control signal 299a. Processor 298 can be coupled to detector system 270 via second control signal 299b. Control signals 299a, 299b can be coupled to illumination system 220 and/or detector system 270 via optical fibers.

In some embodiments, processor 298 can be configured to measure a characteristic of diffraction target 204 based on signal beam 290. For example, the characteristic of diffraction target 204 measured by processor 298 can be an alignment position.

In some embodiments, as shown in FIG. 2, processor 298 can be integrated on illumination system 220. In some embodiments, processor 298 can be external to detector system 270 and coupled to detector system 270, for example, by a fiber optic cable. In some embodiments, processor 298 can be external to illumination system 220 and coupled to illumination system 220, for example, by a fiber optic cable. In some embodiments, processor 298 can be configured to determine intra-field distortion based on the characteristic of diffraction target 204 (e.g., alignment position, etc.) detected by detector system 270.

Illumination system 220 and detector system 270 can be separated by displacement angle 212. Displacement angle 212 can be configured to be about 1 degrees to about 3 degrees. As shown in FIG. 2, displacement angle 212 can include first displacement angle 212a between illumination system 220 and an axis perpendicular to diffraction target 204, and second displacement angle 212b between detector system 270 and the axis perpendicular to diffraction target 204. In some embodiments, first and second displacement angles 212a, 212b are equal. Sensor apparatus 200 can be configured to be a self-aligned and compact system. As shown in FIG. 2, longitudinal area 214 of sensor apparatus 200 can be less than about 10 mm by 10 mm Alternative Sensor Apparatus FIG. 4 illustrates a top perspective schematic of an alternative sensor apparatus 200', according to various embodiments. The embodiments of sensor apparatus 200 shown in FIGS. 2 and 3 and the embodiments of sensor apparatus 200' shown in FIG. 4 are similar. Similar reference numbers are used to indicate similar features of the embodiments of sensor apparatus 200 shown in FIGS. 2 and 3 and the similar features of the embodiments of sensor apparatus 200' shown in FIG. 4. The main differences between the embodiments of sensor apparatus 200 shown in FIGS. 2 and 3 and the embodiments of sensor apparatus 200' shown in FIG. 4 are illumination system 220' includes first variable phase modulator 254a, second variable phase modulator 254b, first illumination waveguide 234, and second illumination waveguide 236, and detector system 270 is disposed between first variable phase modulator 254a coupled to first illumination waveguide 234 and second variable phase modulator 254b coupled to second illumination waveguide 236.

As shown in FIG. 4, sensor apparatus 200' includes illumination system 220' and detector system 270. Although sensor apparatus 200' is shown in FIG. 4 as a stand-alone apparatus, the embodiments of this disclosure are not limited to this example, and sensor apparatus 200' embodiments of this disclosure can be used with other optical systems, such as, but not limited to, sensor apparatus 200, lithographic apparatus LA, and/or other optical systems. Illumination system 220' can include adjustable optic 250. Adjustable optic 250 can include variable phase modulator 254, first illumination waveguide 234, and second illumination waveguide 236.

Variable phase modulator 254 can include first and second variable phase modulators 254a, 254b. First and second variable phase modulators 254a, 254b can be configured to adjust a position of first and second coherent off-axis illumination beams 228, 230, respectively, by adjusting a propagation constant of first and second variable phase modulators 254a, 254b. For example, a propagation constant of first and second variable phase modulators 254a, 254b can be adjusted (e.g., by applying a thermal gradient, a voltage, a pressure, a backfilled gas to change the refractive index, etc.) to alter a position of first and second coherent off-axis illumination beams 228, 230 coupled to first and second illumination waveguides 234, 236, respectively. By adjusting a propagation constant of first and second variable phase modulators 254a, 254b, first and second angles of incidence 238, 240 of first and second coherent off-axis illumination beams 228, 230, respectively, can be changed such that a periodicity of fringe pattern 242 is proportionally changed. First and second variable phase modulators 254a, 254b can be adjusted (e.g., propagation constant B) to adjust the periodicity of fringe pattern 242 to match the periodicity of diffraction target 204. First and second illumination waveguides 234, 236 can be fixed and be configured to couple first and second coherent off-axis illumination beams 228, 230 from first and second variable phase modulators 254a, 254b, respectively, toward diffraction target 204.

In some embodiments, first and/or second variable phase modulators 254a, 254b can include an electro-optic modulator (EOM), an acousto-optic modulator (AOM), or a liquid crystal modulator (LCM). In some embodiments, first and/or second variable phase modulators 254a, 254b can be configured to adjust first and second illumination paths 232a, 232b of first and second coherent off-axis illumination beams 228, 230, respectively, and first and second angles of incidence 238, 240 of first and second coherent off-axis illumination beams 228, 230, respectively. For example, a thermal gradient can be applied to first and second variable phase modulators 254a, 254b and control a position or an angle of first and second coherent off-axis illumination beams 228, 230 on diffraction target 204.

First and second illumination waveguides 234, 236 can be configured to receive first and second coherent off-axis illumination beams 228, 230 from first and second variable phase modulators 254a, 254b, respectively, and transmit illumination beam 226 toward diffraction target 204 on substrate 202, disposed adjacent to illumination system 220', and generate signal beam 290. In some embodiments, first and second illumination waveguides 234, 236 can be arranged symmetrically relative to each other. In some embodiments, first and second illumination waveguides 234, 236 can be a structured planar grating.

As shown in FIG. 4, detector system 270 can be disposed between first and second coherent off-axis illumination beams 228, 230 of illumination system 220'. In some embodiments, fixed optic 216, first illumination waveguide 234, and second illumination waveguide 236 can be disposed in a common plane, such that signal beam 290 can be aligned perpendicular to fixed optic 216 and diffraction target 204.

Exemplary Detection System

Figure 5:
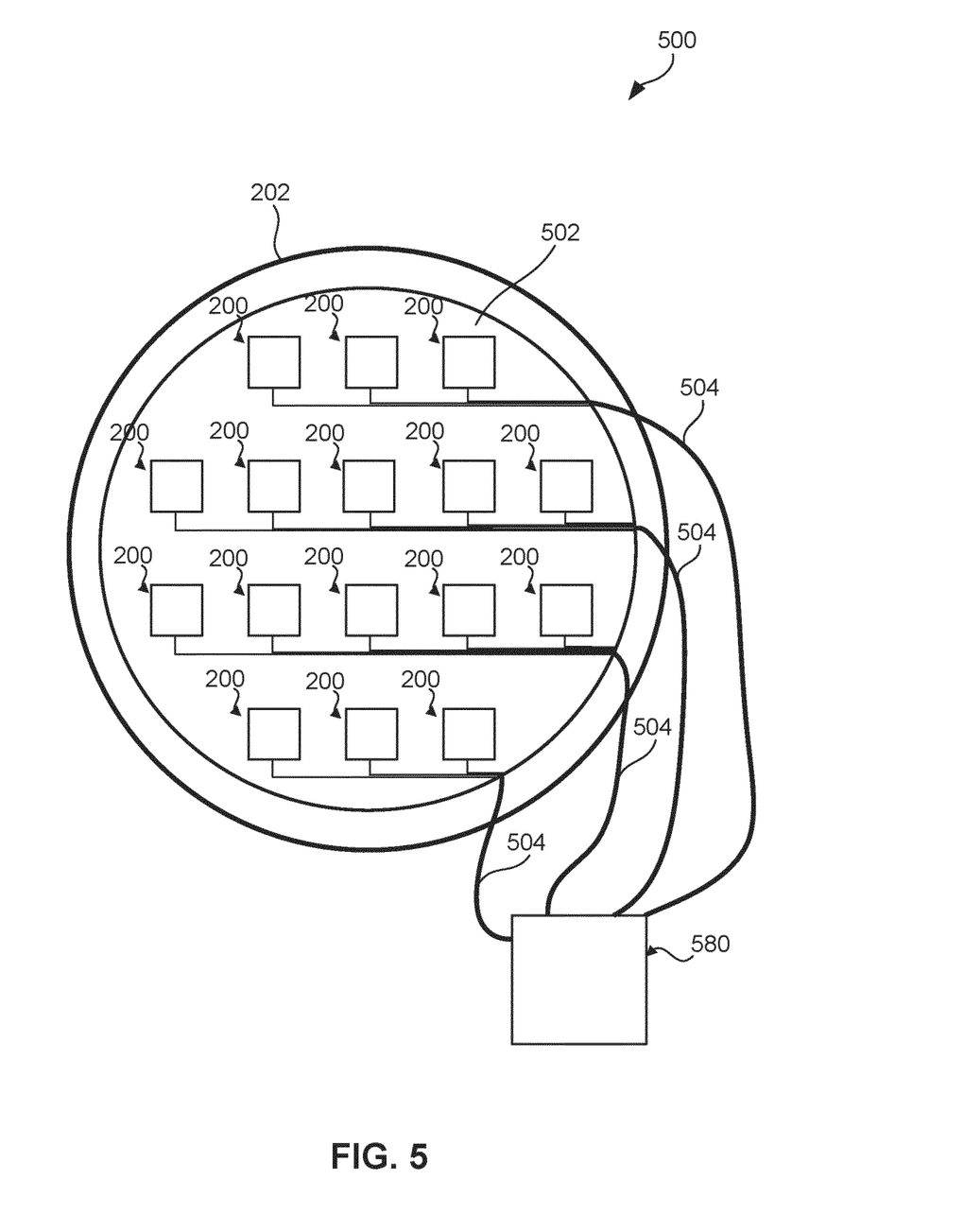
FIG. 5 is a top plan schematic illustration of a detection system, according to an exemplary embodiment.

FIG. 5 illustrates a top plan schematic of detection system 500, according to an exemplary embodiment. Detection system 500 can be configured to measure a characteristic (e.g., alignment position, etc.) of a plurality of diffraction targets 204, similar to diffraction target 204, on substrate 202 and determine an intra-field distortion based on the characteristic of each diffraction target 204 of the plurality of diffraction targets 204 on substrate 202. Detection system 500 can correct intra-field distortion and improve alignment, for example, in lithographic apparatus LA. Detection system 500 can include a plurality of sensors 200, each similar to sensor apparatus 200 or sensor apparatus 200', and second processor 580. As shown in FIG. 5, each sensor apparatus 200 can be disposed on common platform 502 and coupled to second processor 580. For example, as shown in FIG. 5, each sensor apparatus 200 can be connected to second processor 580 via optical fiber 504. Common platform 502 and the plurality of sensors 200 can be disposed above the plurality of diffraction targets 204. Although detection system 500 is shown in FIG. 5 as a stand-alone apparatus, the embodiments of this disclosure are not limited to this example, and detection system 500 embodiments of this disclosure can be used with other optical systems, such as, but not limited to, lithographic apparatus LA and/or other optical systems.

In some embodiments, as shown in FIG. 5, a sensor array can be formed of the plurality of sensors 200 disposed on common platform 502. In some embodiments, the plurality of sensors 200 can be arranged symmetrically relative to each other on common platform 502. In some embodiments, the characteristic of diffraction target 204 is an alignment position. In some embodiments, each processor 298 or detector system 270 of the plurality of sensors 200 can measure the characteristic of the plurality of diffraction targets 204 disposed under each sensor 200 on substrate 202 simultaneously or in real-time. For example, a plurality of characteristics of a plurality of diffraction targets 204 measured by a plurality of sensors 200 can occur within 0.2 seconds.

The embodiments may further be described using the following clauses:

1. A sensor apparatus comprising:
    an illumination system, configured to transmit an illumination beam along an illumination path, comprising an adjustable optic configured to transmit the illumination beam toward a diffraction target on a substrate that is disposed adjacent to the illumination system, wherein the transmitting generates a fringe pattern on the diffraction target, and a signal beam comprising diffraction order sub-beams that are diffracted by the diffraction target;
    a detector system configured to collect the signal beam; and
    a processor configured to measure a characteristic of the diffraction target based on the signal beam,
    wherein the adjustable optic is configured to adjust an angle of incidence of the illumination beam on the diffraction target to adjust a periodicity of the fringe pattern to match a periodicity of the diffraction target.

2. The sensor apparatus of clause 1, wherein the characteristic of the diffraction target is an alignment position.

3. The sensor apparatus of clause 1, wherein the adjustable optic comprises a prism mirror configured to adjust a position of the illumination beam by adjusting a position of the prism mirror relative to the illumination beam.

4. The sensor apparatus of clause 3, wherein the prism mirror comprises a microelectromechanical system-based actuator.

5. The sensor apparatus of clause 1, wherein the adjustable optic comprises a variable phase modulator configured to adjust a position of the illumination beam by adjusting a propagation constant of the variable phase modulator.

6. The sensor apparatus of clause 5, wherein the variable phase modulator comprises an electro-optic modulator, an acousto-optic modulator, or a liquid crystal modulator.
7. The sensor apparatus of clause 1, wherein the illumination system comprises a coherent illumination source and the illumination beam comprises a first coherent off-axis illumination beam and a second coherent off-axis illumination beam.
8. The sensor apparatus of clause 7, wherein the fringe pattern is generated by interference of the first and second coherent off-axis illumination beams.
9. The sensor apparatus of clause 7, wherein the illumination system comprises a first optic configured to transmit the first coherent off-axis illumination beam toward the diffraction target and a second optic configured to transmit the second coherent off-axis illumination beam toward the diffraction target.
10. The sensor apparatus of clause 7, wherein an angle of incidence of the first coherent off-axis illumination beam and an angle of incidence of the second coherent off-axis illumination beam are the same.
11. The sensor apparatus of clause 1, wherein the detector system comprises a fixed optic configured to collect the signal beam and a detector configured to detect a first diffraction order sub-beam of the signal beam, a second diffraction order sub-beam of the signal beam, and a third diffraction order sub-beam of the signal beam.
12. The sensor apparatus of clause 11, wherein the detector comprises a multi-mode fiber.
13. The sensor apparatus of clause 1, wherein the illumination system and the detector system are separated by an angle of about 1 degrees to about 3 degrees.
14. The sensor apparatus of clause 1, wherein:
    a longitudinal area of the sensor apparatus is no greater than about 10 mm by 10 mm; and
    the illumination beam wavelength is about 500 nm to about 2000 nm.
15. The sensor apparatus of clause 1, wherein the illumination beam comprises a first coherent off-axis illumination beam and a second coherent off-axis illumination beam, and the detector system is disposed between the first and second coherent off-axis illumination beams.
16. A detection system comprising:
    a plurality of sensors arranged symmetrically relative to each other and disposed above a plurality of diffraction targets on a substrate, each sensor comprising:
        an illumination system, configured to transmit an illumination beam along an illumination path, comprising an adjustable optic configured to transmit the illumination beam toward a diffraction target on a substrate that is disposed adjacent to the illumination system, wherein the transmitting generates a fringe pattern on the diffraction target, and a signal beam comprising diffraction order sub-beams that are diffracted by the diffraction target;
        a detector system configured to collect the signal beam; and
        a processor configured to measure a characteristic of the diffraction target based on the signal beam, wherein the adjustable optic is configured to adjust an angle of incidence of the illumination beam on the diffraction target to adjust a periodicity of the fringe pattern to match a periodicity of the diffraction target; and
    a second processor coupled to each sensor and configured to determine a processing error based on the characteristic of each diffraction target of the plurality of diffraction targets on the substrate.
17. The detection system of clause 16, wherein the characteristic of the diffraction target is an alignment position.
18. The detection system of clause 16, wherein each detector system measures the characteristic of the plurality of diffraction targets on the substrate simultaneously.
19. The detection system of clause 16, wherein the plurality of sensors are integrated on a common platform.
20. The detection system of clause 16, wherein the second processor is coupled to each sensor via an optical fiber.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A sensor apparatus comprising:
   an illumination system, configured to transmit an illumination beam along an illumination path, comprising:
      an adjustable optic comprising a prism mirror or variable phase modulator configured to transmit the illumination beam toward a diffraction target on a substrate that is disposed adjacent to the illumination system,
      wherein the transmitting generates a fringe pattern on the diffraction target and a signal beam comprising diffraction order sub-beams that are diffracted by the diffraction target,
      wherein the prism mirror or the variable phase modulator is configured to adjust an angle of incidence of the illumination beam on the diffraction target to adjust a periodicity of the fringe pattern to match a periodicity of the diffraction target;
   a detector system configured to collect the signal beam; and
   a processor configured to measure a characteristic of the diffraction target based on the signal beam.

2. The sensor apparatus of claim 1, wherein the characteristic of the diffraction target is an alignment position.

3. The sensor apparatus of claim 1, wherein the prism mirror is configured to adjust a position of the illumination beam by adjusting a position of the prism mirror relative to the illumination beam.

4. The sensor apparatus of claim 1, wherein the prism mirror comprises a microelectromechanical system-based actuator.

5. The sensor apparatus of claim 1, wherein the variable phase modulator is configured to adjust a position of the illumination beam by adjusting a propagation constant of the variable phase modulator.

6. The sensor apparatus of claim 1, wherein the variable phase modulator comprises an electro-optic modulator, an acousto-optic modulator, or a liquid crystal modulator.

7. The sensor apparatus of claim 1, wherein;
   the illumination system further comprises a coherent illumination source, and
   the illumination beam comprises a first coherent off-axis illumination beam and a second coherent off-axis illumination beam.

8. The sensor apparatus of claim 7, wherein the fringe pattern is generated by interference of the first and second coherent off-axis illumination beams.

9. The sensor apparatus of claim 7, wherein the illumination system further comprises a first optic configured to transmit the first coherent off-axis illumination beam toward the diffraction target and a second optic configured to transmit the second coherent off-axis illumination beam toward the diffraction target.

10. The sensor apparatus of claim 7, wherein an angle of incidence of the first coherent off-axis illumination beam and an angle of incidence of the second coherent off-axis illumination beam are the same.

11. The sensor apparatus of claim 1, wherein the detector system comprises a fixed optic configured to collect the signal beam and a detector configured to detect a first diffraction order sub-beam of the signal beam, a second diffraction order sub-beam of the signal beam, and a third diffraction order sub-beam of the signal beam.

12. The sensor apparatus of claim 11, wherein the detector comprises a multi-mode fiber.

13. The sensor apparatus of claim 1, wherein the illumination system and the detector system are separated by an angle of about 1 degrees to about 3 degrees.

14. The sensor apparatus of claim 1, wherein:
   a longitudinal area of the sensor apparatus is no greater than about 10 mm by 10 mm; and
   the illumination beam has a wavelength of about 500 nm to about 2000 nm.

15. The sensor apparatus of claim 1, wherein the illumination beam comprises a first coherent off-axis illumination beam and a second coherent off-axis illumination beam, and the detector system is disposed between the first and second coherent off-axis illumination beams.

\* \* \* \* \*